(12) United States Patent  (10) Patent No.: US 7,883,822 B2
Burgess et al.  (45) Date of Patent: Feb. 8, 2011

(54) GRADED LITHOGRAPHIC MASK

(75) Inventors: Byron N. Burgess, Allen, TX (US); Stuart M. Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 395 days.

(21) Appl. No.: 11/873,473

(22) Filed: Oct. 17, 2007

(65) Prior Publication Data

US 2009/0104540 A1  Apr. 23, 2009

(51) Int. Cl.
*G03F 1/00* (2006.01)
*C25F 3/00* (2006.01)

(52) U.S. Cl. ............................................. 430/5; 216/12

(58) Field of Classification Search ....................... 430/5, 430/296, 311–313, 322–324; 216/12
See application file for complete search history.

(56) References Cited

U.S. PATENT DOCUMENTS

| | | | |
|---|---|---|---|
| 5,672,450 A | 9/1997 | Rolfson | |
| 5,948,571 A | 9/1999 | Mih et al. | |
| 6,534,221 B2 | 3/2003 | Lee et al. | |
| 7,052,806 B2 | 5/2006 | Nishi | |
| 2006/0292454 A1* | 12/2006 | Suda | 430/5 |
| 2009/0023078 A1* | 1/2009 | Gutmann et al. | 430/5 |

* cited by examiner

*Primary Examiner*—Stephen Rosasco
*Assistant Examiner*—Stewart A Fraser
(74) *Attorney, Agent, or Firm*—Warren L. Franz; Wade J. Brady, III; Frederick J. Telecky, Jr.

(57) ABSTRACT

In one aspect there is provided a gray scale lithographic mask that comprises a transparent substrate and a metallic layer located over the substrate, wherein the metallic layer has tapered edges with a graded transparency. The lithographic mask, along with etching processes may be used to transfer a pattern 450a into a layer of a semiconductor device.

22 Claims, 7 Drawing Sheets

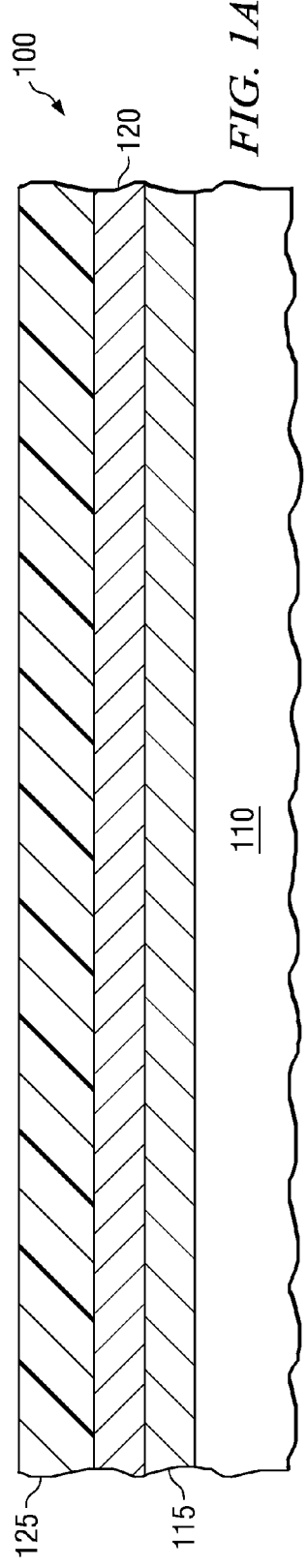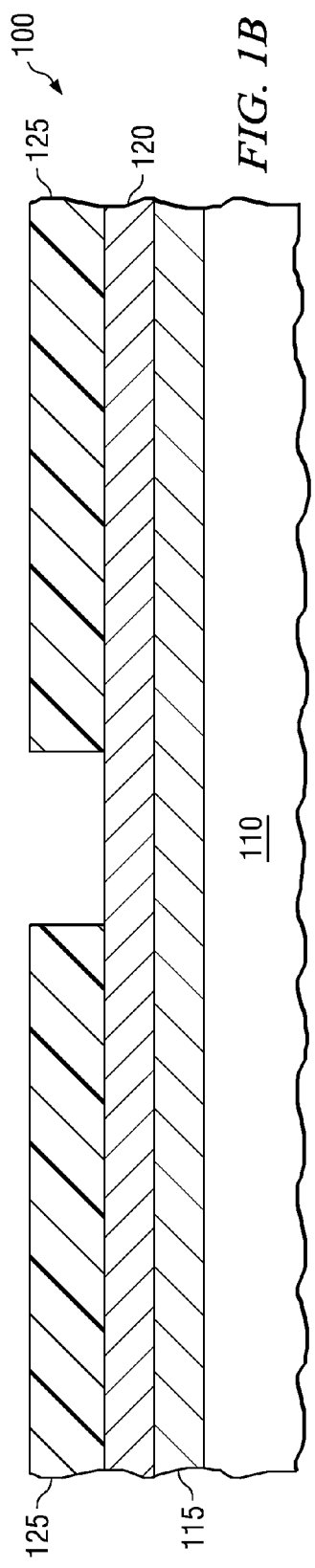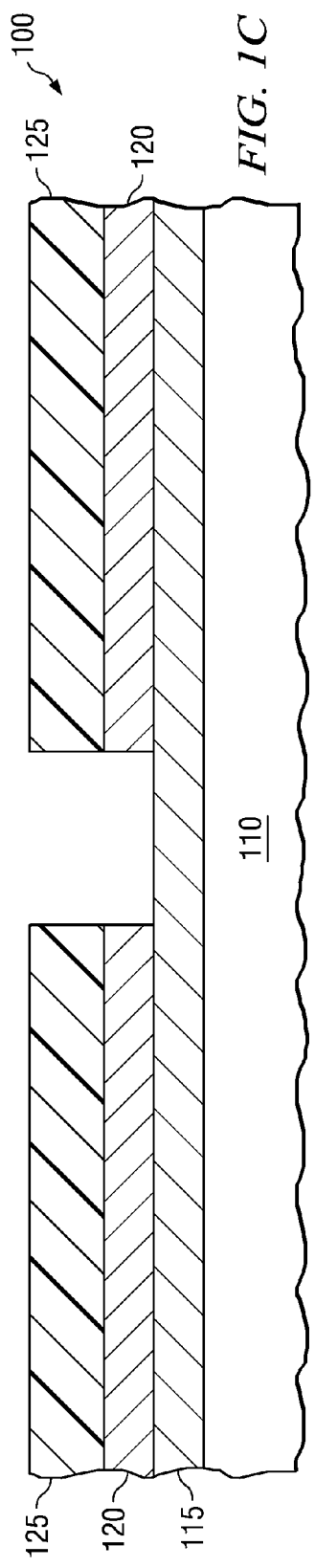

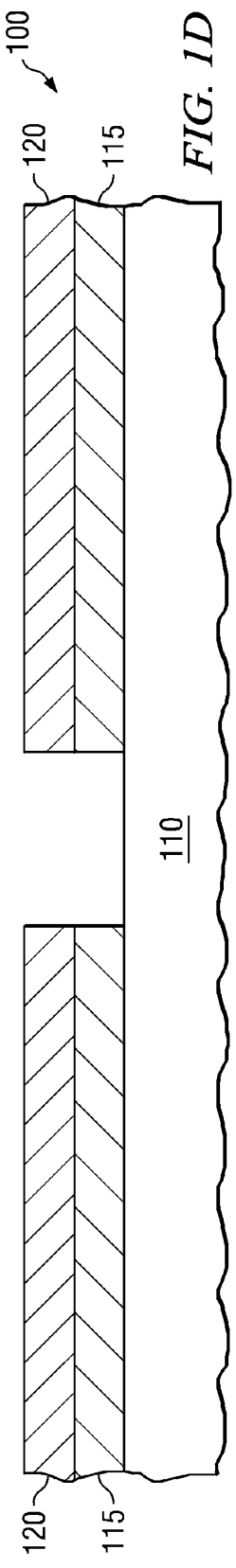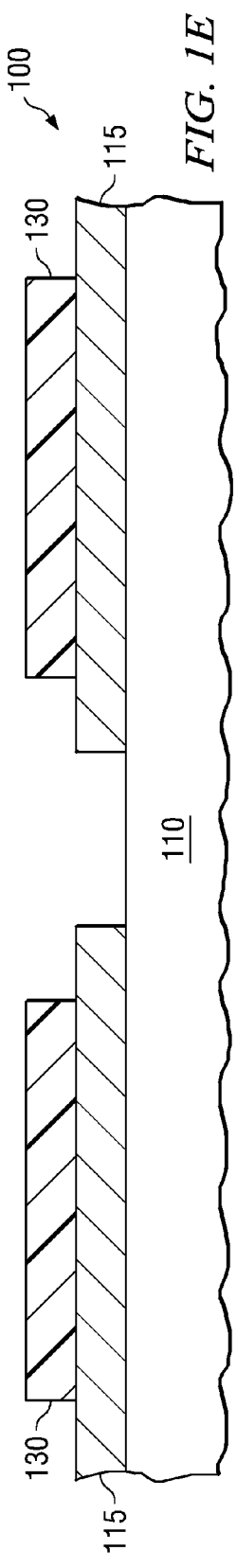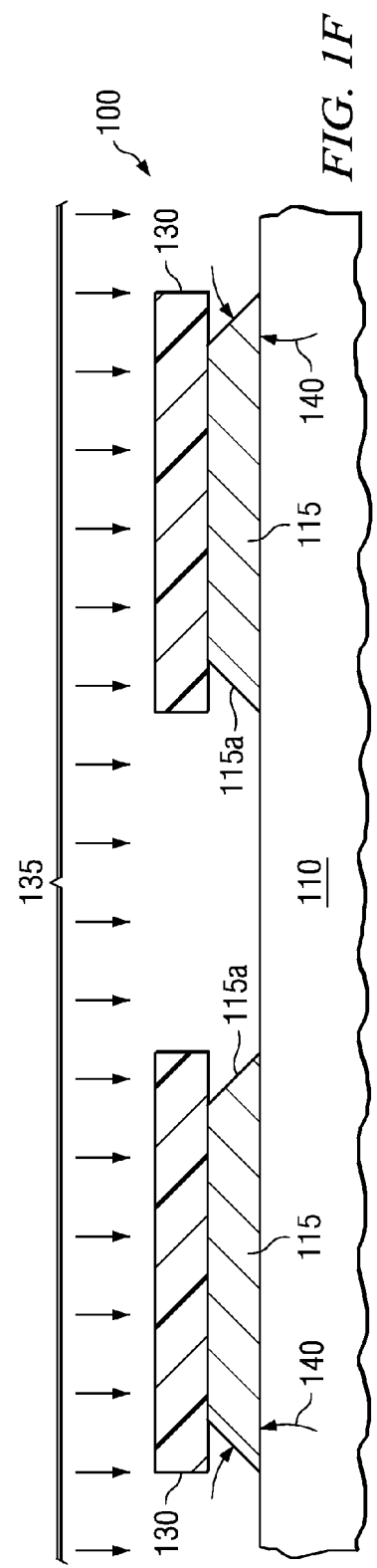

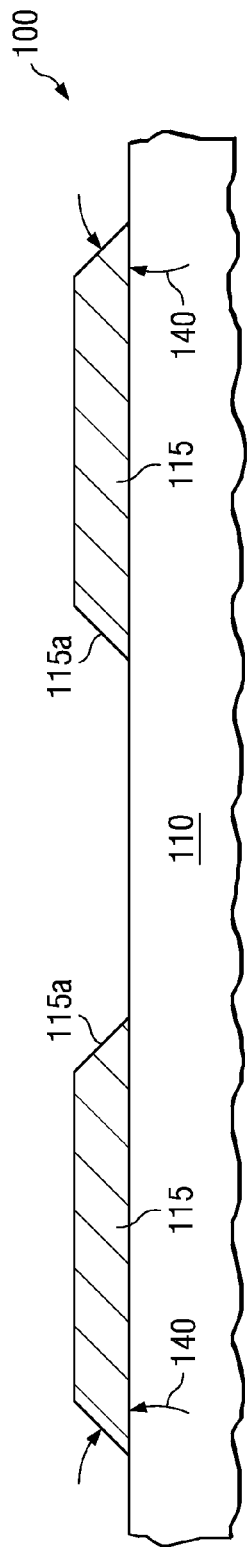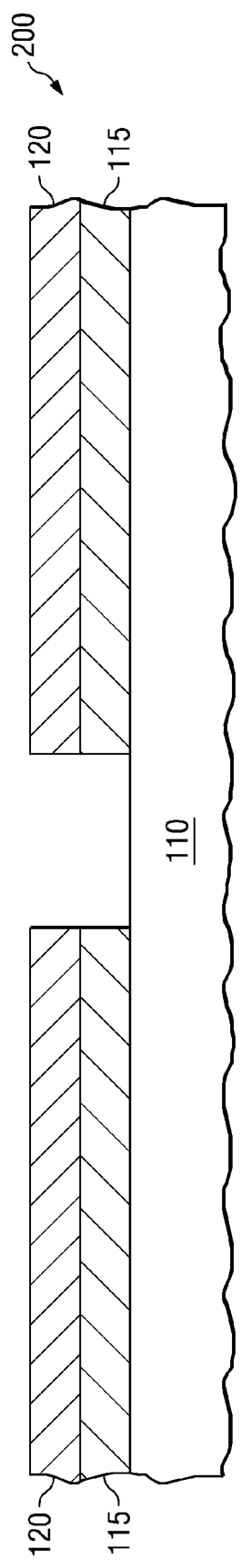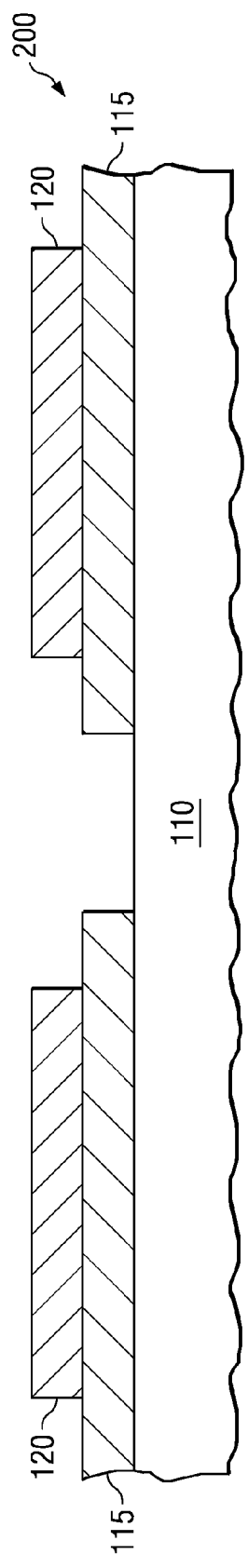

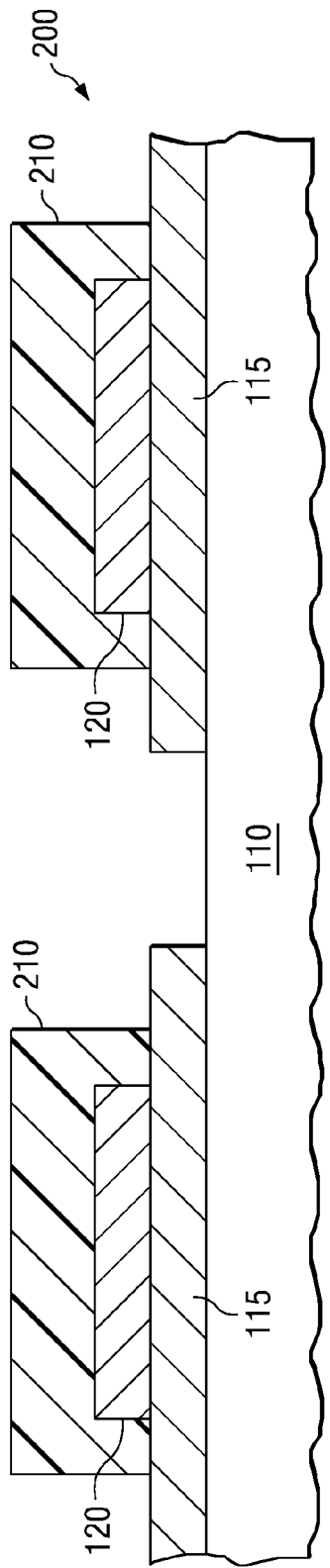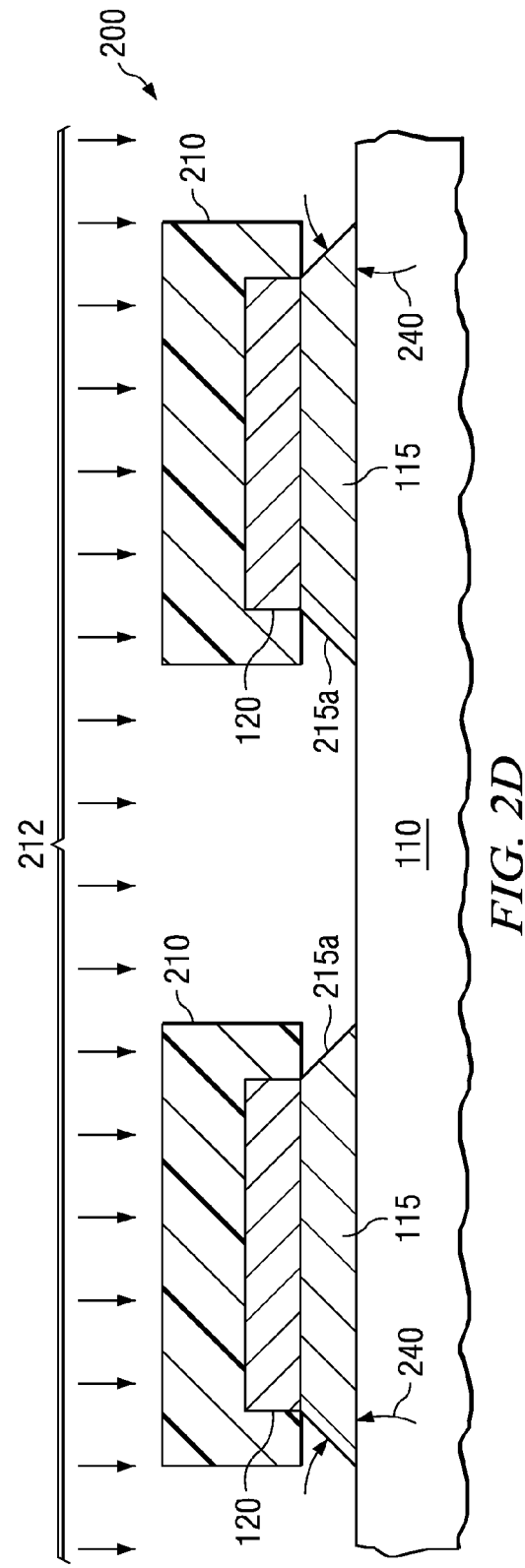

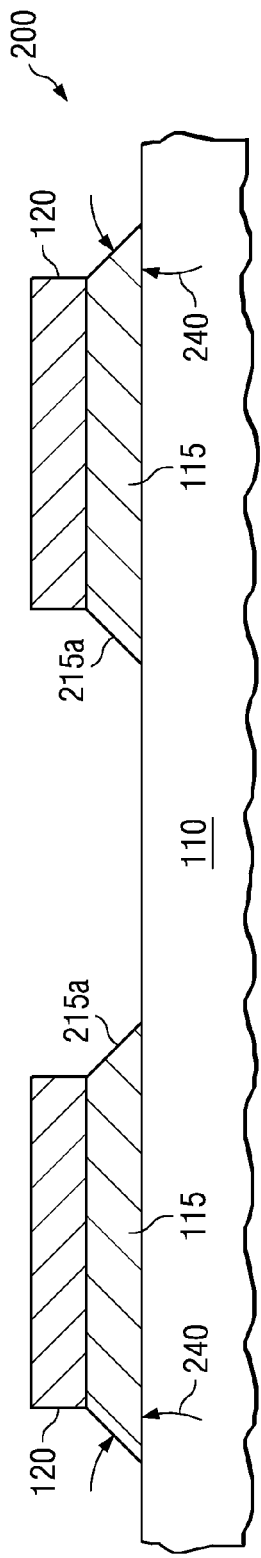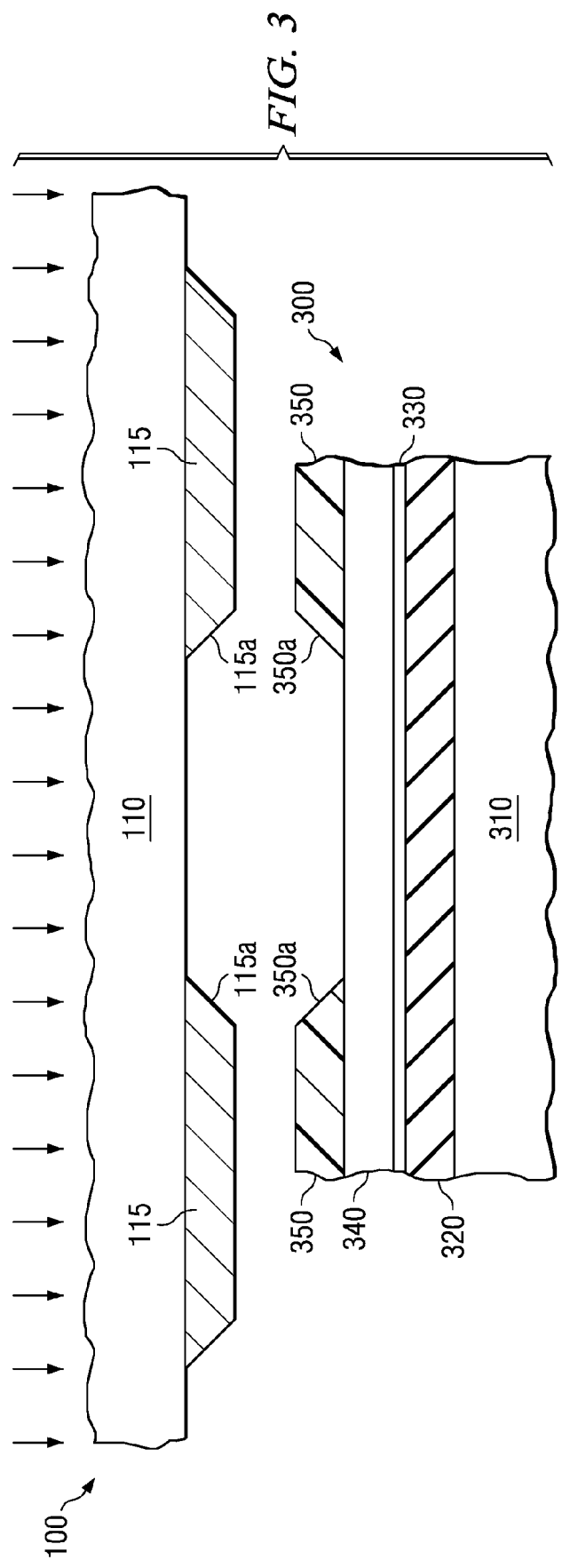

GRADED LITHOGRAPHIC MASK

The invention is directed to a graded lithography mask, a method of manufacturing that mask, and a method of using the mask to fabricate a semiconductor device.

BACKGROUND

In the manufacture of semiconductor integrated circuit (IC) devices, a technique known as lithography is used for transferring ultrasmall circuitry patterns onto a semiconductor wafer. The lithography technique typically includes a projection exposure apparatus, which loads a photomask and transfers the patterns located on the photomask onto a semiconductor wafer to expose portions of a photosensitive material located on the wafer. These patterns ultimately result in component structures, e.g., transistors, capacitors, diodes, microelectromechanical systems (MEMS) devices, heating elements, optoelectrical devices, etc. Since the exposure area of the photomask is smaller in size than the area of the wafer, a wafer surface is typically divided into a plurality of "shots" that are conducted in a stepping fashion across the wafer.

Depending on the type and size of structures that are to be fabricated, different types of photomasks can be used. For example, the photomask may be a binary mask, a gray scale mask, or a phase shift mask. Binary masks typically consist of a quartz substrate with a patterned chromium layer located over it. This mask has been used extensively over the years in fabricating semiconductor devices. A gray scale mask can be used where a slope or stepped configuration needs to be incorporated into a layer of a device component or structure. In such instances, the chromium layer can be patterned from progressively smaller to larger exposure areas, which effectively form the slope or stepped edge configuration in the targeted wafer substrate or layer during a plasma etch.

In recent years, however, device patterns have been made progressively smaller and denser to meet the demand for higher performance devices. To achieve the reduced feature sizes, manufacturers have had to turn to using much smaller and denser patterns on photomasks. Consequently, shorter wavelengths are needed to properly expose these patterns onto an underlying photosensitive material.

As an alternative to previous photomasks and to accommodate the shorter wavelengths, phase shift masks have been developed. The phase shift mask is a mask having a translucent film formed on a transparent plate for attenuating the exposing light and shifting the phase. Typically, the transmission of the exposure light through the film is desirable in the range between approximately 1% and 40%. The light transmitted through this film is adjusted to have certain phase differences from the light that does not pass through the film. The best phase difference for achieving the highest resolution is at about 180° and odd multiples thereof. However, the resolution can be improved when the phase is approximately 180°+/−0.90°. When using a phase shift mask, the resolution may be improved by approximately 5% to 20%, thereby providing manufacturers with the ability to manufacture smaller and denser device components.

These binary, gray scale, and phase shift masks have been found to work well in fabricating different types of devices.

SUMMARY

One aspect of the invention provides a method of manufacturing a semiconductor device. In this embodiment, the method comprises placing a radiation sensitive mask layer over a layer that is located over a semiconductor substrate. A lithography mask is used to expose the mask layer. The lithography mask includes a transparent substrate having a radiation attenuating layer located thereover, and the radiation attenuating layer has tapered edges wherein the tapered edges have a graded radiation transmissivity. This embodiment further includes patterning the mask layer including forming tapered edges on the mask layer and etching the layer through the patterned mask layer to form a layer having tapered edges.

Another embodiment provides a lithography mask that comprises a transparent substrate and a radiation attenuating layer located over the substrate, wherein the radiation attenuating layer has tapered edges with a graded transparency. The tapered edges are formed by wet etching the radiation attenuating layer using a mask that is patterned to have side edges pulled back from side edges of the masking layer, so that the etch undercuts the side edges of the masking layer to taper the etched the exposed side and top edges of the radiation attenuating layer.

Yet another embodiment provides a method of fabricating a lithography mask wherein a metal layer deposited over the radiation attenuating layer is patterned to remain over non-tapered edge portions of the patterned radiation attenuating layer. In a described embodiment, the metal layer is formed over the radiation attenuating layer prior to wet etching the radiation attenuating layer, and the wet etching proceeds through a patterned resist layer formed over the metal layer leaving side and top edges of the radiation attenuating layer exposed to form the tapered edges having the graded transmissivity.

BRIEF DESCRIPTION OF THE DRAWINGS

For a more complete understanding of the invention, reference is made to the following descriptions taken in conjunction with the accompanying drawings, in which:

FIGS. 1A-1G illustrate an embodiment of a method used to fabricate a lithography mask provided by the invention;

FIGS. 2A-2E illustrate another embodiment of a method used to fabricate a lithography mask provided by the invention;

FIG. 3 illustrates a method of using the lithography mask of FIG. 1G and an etch to transfer a pattern of the mask into a resist layer;

DETAILED DESCRIPTION

Figure 4:
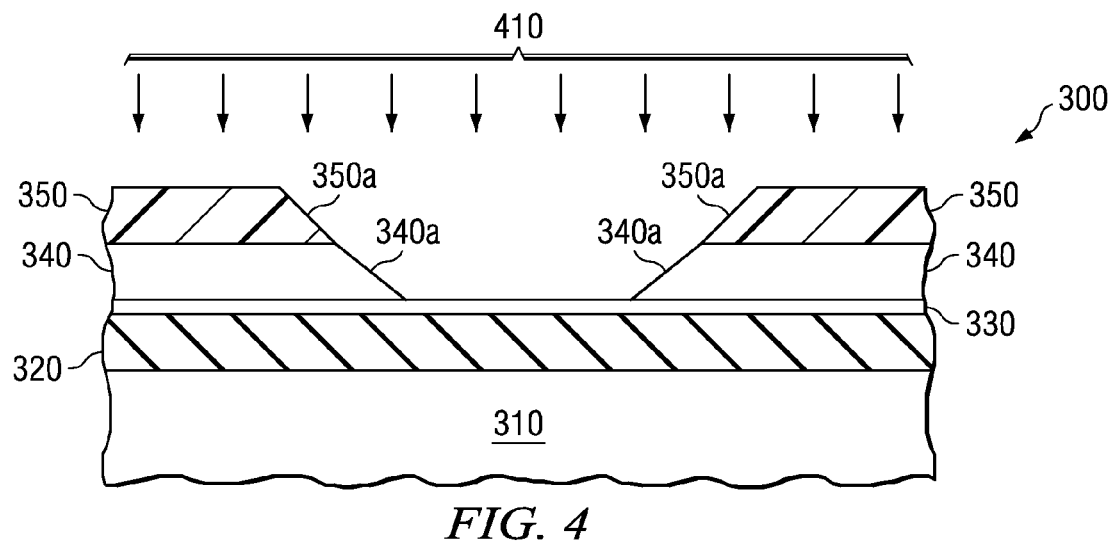
FIG. 4 illustrates using the patterned resist layer of FIG. 3 to etch the transferred pattern into a layer of a semiconductor device.

FIG. 1A illustrates an embodiment of a lithography mask 100 at a stage of manufacture, as covered by the invention. At this stage, the mask 100 includes a mask substrate 110 and a phase shift layer 115 located over the mask substrate 110. The mask substrate 110 is translucent; that is, radiation, such as different wavelengths of light, can pass through the mask substrate 110 with a transmission sufficient to expose a photosensitive material. Non-limiting examples of radiation include white light, ultraviolet light, or monochromatic light, such as that produced by a laser. In one embodiment, the mask substrate 110 is provided. As used herein "provided or providing" includes those instances where the substrate 110 is obtained from a supplier or fabricated by the mask manufacturer itself. The substrate 110 may be a material, such as quartz, sapphire, or other material that has good transparency; that is, it has the property of transmitting light without appreciable scattering so that bodies lying beyond the substrate 110 can be seen clearly. The phase shift layer 115 is located over the mask substrate 110. The phase shift layer 115 includes a material having a desired refractive index, and a predetermined thickness of this material is locally added in order to phase shift radiation passing through a transparent portion of the mask. Phase shifting increases resolution of pattern transfer by destructive interference, preventing resist exposure in the regions in which the resist should not be exposed.

The layer 115 may be deposited using conventional deposition processes. The layer 115 may comprise conventional lithography mask materials. In one embodiment, the mask material may be a metallic layer, which is one that includes a metal or metal alloy, such as molybdenum. In one particular embodiment, the layer 115 is a metal silicide, such as molybdenum silicide ($MoSi_2$). The amount of phase shift and transmission of the layer 115 may vary, depending on the type, component and size of the semiconductor device that is being manufactured. In certain embodiments, the polarity phase shift may be as much as 180°, but in some instances may be around 120°. In those instances where the layer 115 comprises MoSi, the transmission of the radiation through layer 115 may be about 6%. This embodiment may be applicable in larger technologies such as those having node sizes of 0.5 microns or larger, which is very suitable for the manufacture of MEMS devices. In another embodiment where the layer 115 is MoSi, the transmission of the radiation through layer 115 may be within a range of about 12% to about 40%. In this embodiment, shorter wavelengths may be employed to achieve the desired resolution. This embodiment may be applicable in smaller technologies, such as those having node sizes of about 90 nm or smaller.

In certain embodiments, a metallic mask layer 120 is deposited over the phase shift layer 115. Conventional materials and deposition processes may be used to form layer 120. For example, the metallic mask layer 120 may comprise chromium or alloys thereof. A resist layer 125 is also located over the metallic mask layer 120. The resist layer 125 may be a conventionally deposited photosensitive material, such as photoresist.

In an embodiment where the phase shift layer 115 has a lower transmission, conventional processes may be used to pattern the resist layer 125, as shown in FIG. 1B, and an etch may then be conducted through the patterned resist layer 125 to etch and pattern the mask layer 120, as shown in FIG. 1C. This may also be achieved with a conventional etch process. Following the patterning of the mask layer 120, a standard etch may be conducted to pattern the phase shift layer 115, as shown in FIG. 1D.

Following the patterning of the phase shift layer 115, the mask layer 120 is removed, which may be achieved using conventional processes. Another resist layer 130 is then deposited over the phase shift layer 115 and patterned, as shown in FIG. 1E. Conventional processes may be used to deposit and pattern the resist layer 130. As seen in FIG. 1E, the side edges of the resist layer 130 are pulled back from the side edges of the phase shift layer 115 to expose both the side edges and the top edges to provide good exposure of layer 115 to a subsequent etch.

Following the patterning of the resist layer 130, a wet etch 135 is conducted to remove those portions of the phase shift layer 115 that are not protected by the resist layer 130, as seen in FIG. 1F. The wet etch 135 etches under the resist layer 130 and causes progressive further exposure of a top edge portion of the phase shift layer 115 to the wet etch 135, resulting in a tapered contour on an etched edge 115a of the phase shift layer 115 having a continuously varying thickness, as shown. The wet etch 135 may be controlled to vary the amount of taper of the edges 115a. For example, in one embodiment, the tapered edges can be etched to have a slope with angle 140 (as measured from the bottom edge of the phase shift layer 115) within a range of from about 10° to about 75°. In one embodiment, the wet etch 135 includes using hydrogen peroxide ($H_2O_2$). The hydrogen peroxide may be 30% $H_2O_2$ by volume, and in one aspect, the $H_2O_2$ may be hot. In one instance, the hot $H_2O_2$ may have a temperature of about 55° C. The amount of time that the phase shift layer 115 is exposed to the wet etch 135 depends on the degree of desired slope. For example, the phase shift layer 135 may be exposed to the wet etch 135 for a period of time within a range of from about 30 seconds to about 10 minutes. Using the wet etch 135 is beneficial because it can easily be tailored and controlled to produce tapered edges 115a. Following the wet etch 135, the resist layer 130 is removed to arrive at the lithography mask as seen in FIG. 1G.

Due to their graduated thickness, the tapered edges 115a have a graded transparency to the radiation and form a gray scale mask. The lithography mask 100 of FIG. 1G provides benefits over conventional gray scale masks because the use of this particular mask allows for improved process integration where it is desirable to use a plasma etch to etch layers that form portions of semiconductor devices. Furthermore, the tapered edges 115a that are formed by using the lithography mask 100 can produce a more uniform taper than conventional masks that consist of a graduated series of openings, as mentioned above. Other benefits arise in that conventional binary grey scale masks using varying densities of sub-resolution features are susceptible to patterning errors during the mask writing process. These errors include defects such as bridged and/or broken features. The conventional technology also increases mask write/fabrication time due to the increase in the number of polygon features that are patterned. In addition, conventional technology also requires extensive computer modeling to determine the correct density and dimensions for the sub-resolution features required to generate a gray scale effect at the wafer level.

FIGS. 2A-2E illustrate various stages of another method for fabricating a lithography mask 200 in accordance with the invention. In applications involving formation of device nodes of 90 nm and below, the phase shift layer 115 may have a transmission ranging from about 12% to about 40%, as mentioned above. In addition, however, the metallic mask layer 120 may be a chromium layer that can be used with the phase shift layer 115 to obtain the appropriate amount of exposure.

FIG. 2A illustrates the mask 200 at the same stage of manufacture as illustrated in FIG. 1D, and the same steps shown in FIGS. 1A-1D can be used to arrive at the embodiment of FIG. 2A. Here, the metallic mask layer 120 has been patterned with a resist layer, and the mask layer 120 has been used to pattern the phase shift layer 115. In this particular embodiment, the mask layer 120 is shown after an etch process has been conducted such that the side edges of the mask layer 120 are set back from the side edges of the phase shift layer 115 to expose top edges of the shift layer 115 as well, as seen in FIG. 2B. This setback should provide adequate surface area over which another resist layer 210 can be patterned. The resist layer 210 is patterned such that its side edges are also set back from the side edges of the phase shift layer 115 to expose a portion of the top surface of the phase shift layer 115, as shown in FIG. 2C.

A wet etch 212, which may be the same type of wet etch as wet etch 135 discussed above regarding FIG. 1F, may be used to form tapered edges 215a, as illustrated in FIG. 2D. Similar to wet etch 135, the wet etch 212 etches under the resist layer 210 and causes the top corner of the phase shift layer 115 to recede and further expose more of the phase shift layer 115 to the wet etch 212. The wet etch 212 thus etches a tapered contour 215a with continuously varying thickness at the exposed edges of the phase shift layer 115. The wet etch 212 may be controlled to vary the amount of taper of the edges 215a. For example, in one embodiment, the tapered edges 215a can be etched to have a slope of angle 240 (as measured from the bottom edge of the phase shift layer 115) within a range of from about 10° to about 75.

Following the wet etch 212, the resist 210 may be conventionally removed to arrive at the lithography mask 200, as illustrated in FIG. 2E. In this particular embodiment, the metallic layer 120 remains on the phase shift layer 115 to provide the advantages stated above. Also as mentioned above, this embodiment is particularly beneficial in those instance where very small device features are required.

FIG. 3 illustrates an embodiment of a method of using the lithography mask 100 of FIG. 1G in the manufacture of a semiconductor device 300, which may include, for example, transistor devices, optoelectronic devices, heating elements, or microelectromechanical systems (MEMS) devices. Alternatively, the lithography mask 200 of FIG. 2E may be used instead of mask 100. The device 300 includes a substrate 310. The substrate 310 may comprise many different semiconductor materials. For example, the substrate 310 may comprise any of silicon, silicon-germanium, gallium arsenide, indium, phosphorous, or combinations thereof.

Located over the substrate 310 is an insulative layer 320. The insulative layer 320 electrically insulates subsequently formed layers from the substrate 310. In one embodiment, layer 320 may comprise silicon dioxide. Other insulative materials of varying dielectric constants might be used for layer 320. Layer 320 may have a variety of thicknesses; however, in one embodiment, its thickness may be within a range of from about 500 nm to about 1000 nm.

Located over the insulative layer 320 is a layer 330. The layer 330 may, for example, be a conductive layer or a resistive layer, such as TaAl. However, the layer 330 may also comprise TaN, TaAl(O,N), TaAlSi, TaSiC, Ti(N,O), WSi(O,N), CrSiC, TaAlN and TaAl/Ta, or other materials. The resistive layer 330 may also have any of a variety of thicknesses. In one embodiment, its thickness may be within a range of from about 10 nm to about 200 nm.

Another layer 340 is located over layer 330. The layer 340, in the illustrated embodiment, may be a metal spacer layer, such as AlCu. However, in another embodiment, the layer 340 may be a dielectric layer, such as any of various compositions of silicon oxide or nitride, such as silicon dioxide, silicon nitride or silicon oxynitride. The layer 340 may have any of a variety of thicknesses. In one embodiment, a thickness of the layer 340 may be within a range of from about 200 nm to about 1500 nm.

A resist layer 350, e.g., photoresist, is formed over layer 340, and, as shown, has been exposed, using the lithography mask 100 of FIG. 1G and patterned to form tapered edges 350a. The resist layer 350 is exposed to radiation passing through the lithographic mask 100. The graded, tapered edges 115a of the mask 100, allow varying intensities of light through to form corresponding tapered edges 350a in the resist layer 350. As mentioned above, the gradation of the light intensity arises from the fact that the tapered edges 115a have a variable thickness over the lateral length of the tapered edges 115a.

Conventional processes may be used to form the layers 320, 330 and 340 on the substrate 310. For example, in one embodiment conventional microelectronic fabrication processes such as physical vapor deposition (PVD) (e.g., sputtering) or chemical vapor deposition (CVD) may be used to provide the various layers on the substrate 310. The present disclosure, however, should not be limited to any specific process for forming layers 320, 330 and 340.

With the patterned resist layer 350 in place, an etch 410 may then be conducted to etch the semiconductor device layer 340 to form layer 340 having tapered edges 340a of continuously varying thickness, as shown in FIG. 4. In one embodiment, the etch 410 may be conducted using a conventional plasma etch. Such embodiments are beneficial when it is desired to integrate the process with other plasma etching processes used to manufacture other components of the semiconductor device. The type of plasma etch will depend on the type of material that comprises the layer 340. For example, in one embodiment, where the layer 340 is a dielectric layer, the plasma etch may include using carbon tetrachloride as an etching gas. In another embodiment where the layer 340 is a metallic layer, the plasma etch may include using carbon tetrafluoride, sulfur hexafluoride, or other fluorocarbon chemistries as an etching gas. Process parameters, such as flows and power settings will depend on one or more parameters, such as the material being etched, the tool, the feature size or the chemistries being used. Given the teachings herein, one skilled in the art would understand how to adjust these process parameters to conduct the etch.

Figure 5:
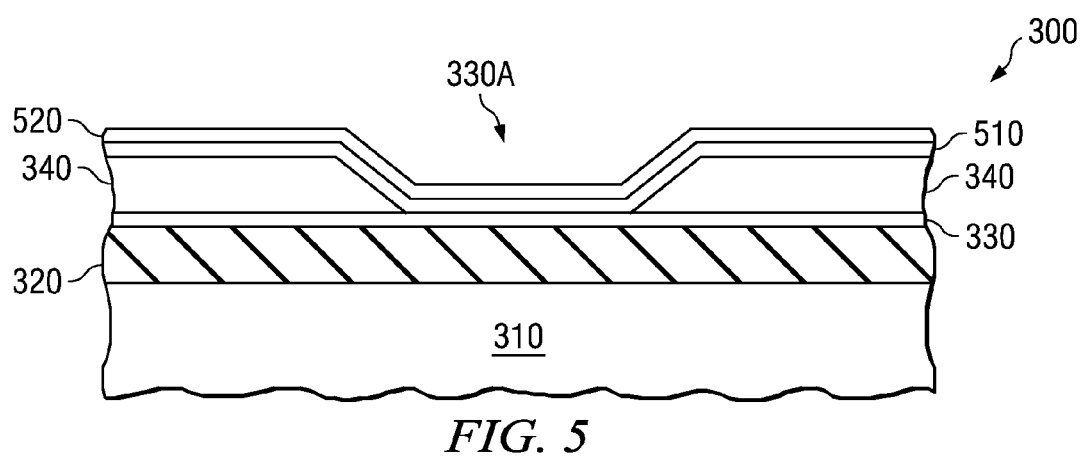
FIG. 5 illustrates the semiconductor device of FIG. 4 after deposition of material layers over the pattern formed in FIG. 4.

FIG. 5 illustrates the semiconductor device 300 following the etch 410 of layer 340 and removal of resist layer 350 (FIG. 3). As seen in FIG. 5, with the formation of the tapered layer 340, other semiconductor device layers 510 and 520 may be deposited over layer 340. The types of layers that are deposited will depend on the type of device being constructed, and the tapered edges can be used for any of a number of purposes, as design dictates. The device 100, as mentioned above, may be any of a number of electrical devices, such as optoelectronics devices, fuses, diodes, heating elements, or MEMS devices, which would also include transistors used to control such devices.

Figure 6:
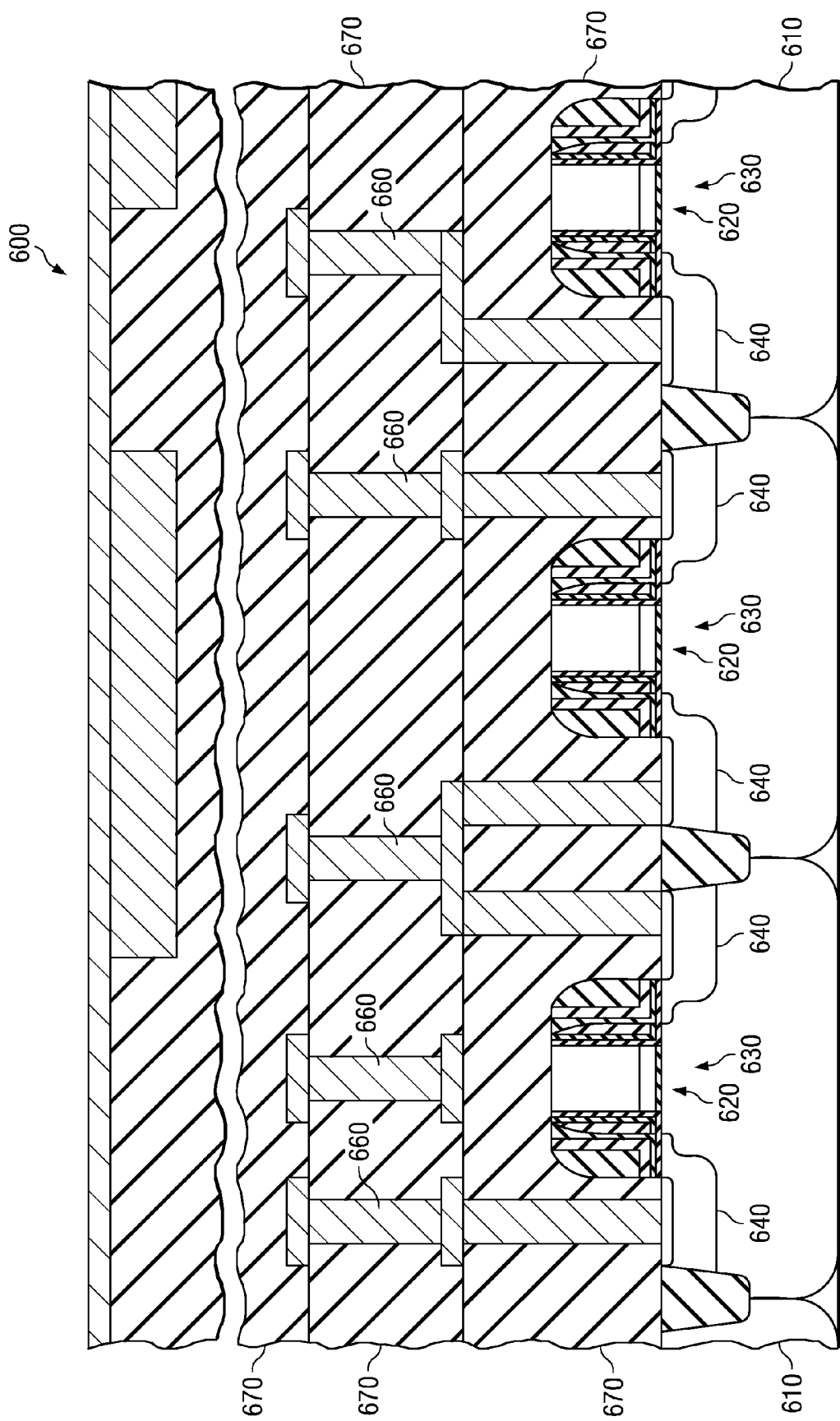
FIG. 6 illustrates an integrated circuit (IC) in which the semiconductor device fabricated in FIG. 6 may be incorporated or with which that device may be combined.

FIG. 6 illustrates the semiconductor device configured as an integrated circuit (IC) 600. The device 600 includes transistor devices 620 located over or in a substrate 610. The transistor devices 620 in this embodiment each includes a gate structure 630 and source/drain regions 640. Since the feature in FIG. 5 may be incorporated into IC 600 in a number of ways, its incorporation in FIG. 6 is not specifically illustrated. However, those who are skilled in the art would understand how to incorporate the feature of FIG. 5 as required by design. For example, the feature of FIG. 5 may be configured as a capacitor, resistor, fuse, Schottky diode, or heating element, etc. without departing from the scope of this disclosure and combined with or incorporated into the IC 600. Located over the devices 620 are interconnects 660 located within dielectric layers 670. As illustrated, the interconnects 660 may electrically contact one or more of the transistor devices 620.

Those skilled in the art will appreciate that other and further additions, deletions, substitutions, and modifications may be made to the described embodiments without departing from the scope the disclosure set forth herein.

What is claimed is:

1. A method of fabricating a gray scale photomask usable for patterning a radiation sensitive layer in a lithography process in the manufacture of a semiconductor device, comprising:
   providing a transparent substrate;
   forming a layer of phase shift material over the transparent substrate;
   patterning the layer of phase shift material to form first openings having first side edges;
   forming a patterned etch mask over the patterned layer of phase shift material; the patterned etch mask having second openings encompassing the first openings, the second openings having second side edges pulled back from the first side edges to expose top edges and the first side edges of the patterned layer of phase shift material; and
   etching the exposed top edges and first side edges of the patterned layer of phase shift material using a wet etch to undercut the second side edges and form the exposed first side edges into tapered edges, the tapered edges having a graded transparency.

2. The method of in claim 1, wherein forming the layer of phase shift material comprises forming a layer of molybdenum silicide material.

3. The method of claim 2, wherein forming the layer of molybdenum silicide material comprises forming the layer of molybdenum silicide material to a thickness providing 6% radiation transmissivity.

4. The method of claim 3, wherein patterning the layer of phase shift material includes:
   forming a metallic masking layer over the layer of phase shift material;
   patterning the metallic masking layer with a first resist to define the first openings; and
   etching the layer of phase shift material through the patterned metallic masking layer.

5. The method of claim 4, wherein the metallic masking layer comprises chromium.

6. The method of claim 2, wherein forming the layer of molybdenum silicide material comprises forming the layer of molybdenum silicide material to a thickness providing about 12% to about 40% radiation transmissivity.

7. The method of claim 1, wherein:
   patterning the layer of phase shift material includes forming a metallic masking layer over the layer of phase shift material; patterning the layer of phase shift material through the metallic masking layer; and further patterning the metallic masking layer to provide third side edges on the metallic masking layer that are pulled back from the first side edges prior to forming the patterned etch mask;
   forming the patterned etch mask over the patterned layer of phase shift material includes forming the patterned etch mask over the further patterned metallic mask layer including over the third edges; and
   etching the exposed top edges and first side edges forms the tapered edges in portions of the layer of phase shift material which do not underlie the further patterned metallic mask layer.

8. The method of claim 1, wherein using the wet etch includes using hydrogen peroxide.

9. The method of claim 8, wherein a temperature of the hydrogen peroxide during the wet etch is about 55° C.

10. The method of claim 9, wherein the wet etch is conducted for a time period of from about 30 seconds to about 10 minutes.

11. A method of fabricating a photomask usable for patterning a radiation sensitive layer in a lithography process in the manufacture of a semiconductor device, comprising:
   forming a radiation attenuating layer over a substantially radiation transmissive substrate;
   patterning the radiation attenuating layer to form first openings having first side edges;
   forming a masking layer over the radiation attenuating layer;
   patterning the masking layer to form second openings encompassing the first openings and having second side edges pulled back from the first side edges to expose top edges of the radiation attenuating layer;
   etching the radiation attenuating layer through the patterned masking layer with a wet etch material, the etching acting to undercut the patterned masking layer at the top edges to etch the first side edges into a tapered contour of continuously varying thickness.

12. The method of claim 11, wherein the radiation attenuating layer comprises molybdenum silicide.

13. The method of claim 11, wherein the masking layer comprises a photoresist.

14. The method of claim 11, wherein patterning the radiation attenuating layer comprises forming a metal layer over the radiation attenuating layer; patterning the metal layer; and etching the radiation attenuating layer through the patterned metal layer.

15. The method of claim 14, further comprising removing the metal layer prior to forming the masking layer.

16. The method of claim 14, wherein the metal layer is further patterned to provide third side edges pulled back from the first side edges; and the masking layer is formed over the metal layer including over the pulled back third side edges.

17. The method of claim 11, wherein the substrate is quartz, sapphire or other transparent material; and the radiation attenuating layer comprises a known phase shift mask material.

18. The method of claim 11, wherein the wet etch material comprises hydrogen peroxide.

19. A method of fabricating a photomask usable for patterning a radiation sensitive layer in a lithography process in the manufacture of a semiconductor device, comprising:
   forming a radiation attenuating layer over a substantially radiation transmissive substrate;
   forming a metal layer over the radiation attenuating layer;
   patterning the radiation attenuating layer to form first openings having first side edges;
   patterning the metal layer to form second side edges pulled back from the first side edges;
   forming a resist layer over the patterned radiation attenuating layer and over the patterned metal layer including over the second side edges;
   patterning the resist layer to form third side edges pulled back from the first side edges, leaving exposed the first side edges and top edges of the radiation attenuating layer; and
   wet etching the radiation attenuating layer through the patterned resist layer with a wet etch material, the wet etching acting to undercut the patterned resist layer at the top edges to etch the first side edges into a tapered contour of continuously varying thickness up to the second side edges.

20. The method of claim 19, wherein the radiation attenuating layer comprises molybdenum silicide.

21. The method of claim 20, wherein the metal layer comprises chrome.

22. The method of claim 21, wherein the wet etch material comprises hydrogen peroxide.

* * * * *